United States Patent [19]

Furutani

[11] Patent Number: 5,285,117
[45] Date of Patent: Feb. 8, 1994

[54] OUTPUT CIRCUIT WITH OUTPUT ENABLING INPUTS

[75] Inventor: Kiyohiro Furutani, Itami, Japan

[73] Assignee: Mitsubishi Denki Kabushiki Kaisha, Tokyo, Japan

[21] Appl. No.: 957,403

[22] Filed: Oct. 6, 1992

[30] Foreign Application Priority Data

Oct. 9, 1991 [JP] Japan .................. 3-261675

[51] Int. Cl.$^5$ .................. H03K 19/003
[52] U.S. Cl. .................. 307/443; 307/473; 307/475; 307/481
[58] Field of Search .............. 307/443, 473, 475, 480, 307/481

[56] References Cited

U.S. PATENT DOCUMENTS

| 4,587,445 | 5/1986 | Kanuma .................. 307/475 X |
| 4,587,446 | 5/1986 | Okumura .................. 307/443 X |
| 4,656,370 | 4/1987 | Kanuma .................. 307/443 |
| 4,857,765 | 8/1989 | Cahill et al. .................. 307/480 X |
| 4,918,339 | 4/1990 | Shigeo et al. .................. 307/443 X |
| 4,983,860 | 1/1991 | Yim et al. .................. 307/443 |

FOREIGN PATENT DOCUMENTS

| 3343700 | 6/1984 | Fed. Rep. of Germany . |
| 3715159 | 12/1987 | Fed. Rep. of Germany . |
| 0148426 | 8/1984 | Japan .................. 307/443 |
| 0130920 | 7/1985 | Japan .................. 307/443 |

OTHER PUBLICATIONS

U. Tietz and Ch. Schenk: Halbleiter-Schaltungstechnik (Semiconductor Circuitry) Springer-Verlag, Berlin, Heidelberg, N.Y. 1974, p. 505.
1989 International Test Conference, "Testing Conventional Logic and Memory Clusters Using Boundary Scan Devices As Virtual ATE Channels".

Primary Examiner—David R. Hudspeth
Attorney, Agent, or Firm—Thomas R. Morrison

[57] ABSTRACT

An output circuit for semiconductor integrated circuit includes control means. It receives an input signal, a reference signal, and a control signal, each having first and second states. When both reference and control signals are in their first state, the control means provides a signal in accordance with the input signal. Output means develops an output signal according to the state of the signal developed by the control means. The timing at which the control signal is placed in its first state is delayed relative to the reference signal in its first state. The time of delay is controlled to change the timing of occurrence of the output signal from the output means.

13 Claims, 13 Drawing Sheets

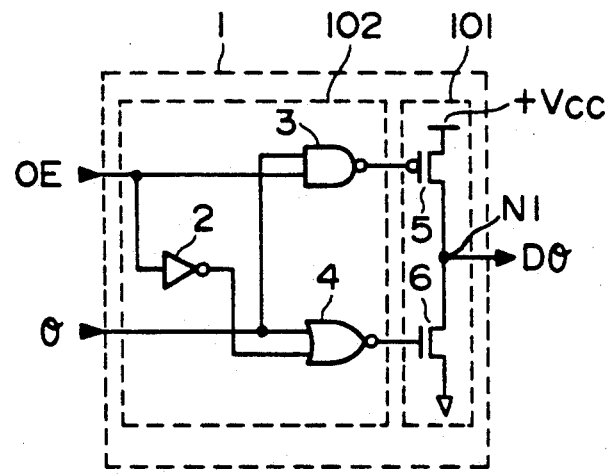
F I G. 1
PRIOR ART
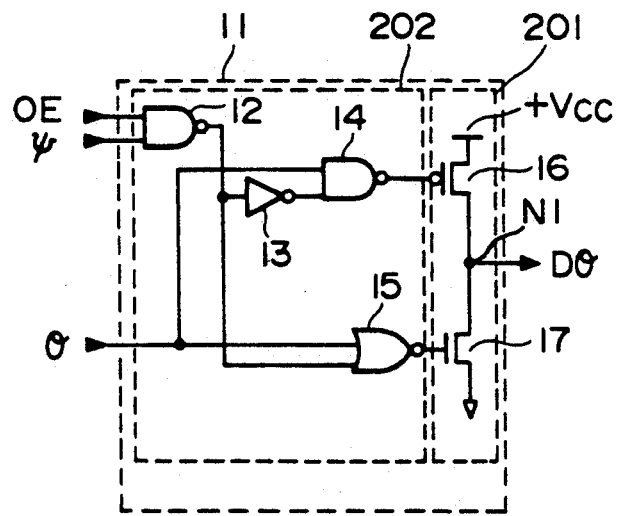
F I G. 4
F I G. 5
| ψ | OE | θ | Dθ |
|---|----|----|----|
| L | L | L | HiZ |
| L | L | H | HiZ |
| L | H | L | HiZ |
| L | H | H | HiZ |
| H | L | L | HiZ |
| H | L | H | HiZ |
| H | H | L | L |
| H | H | H | H |

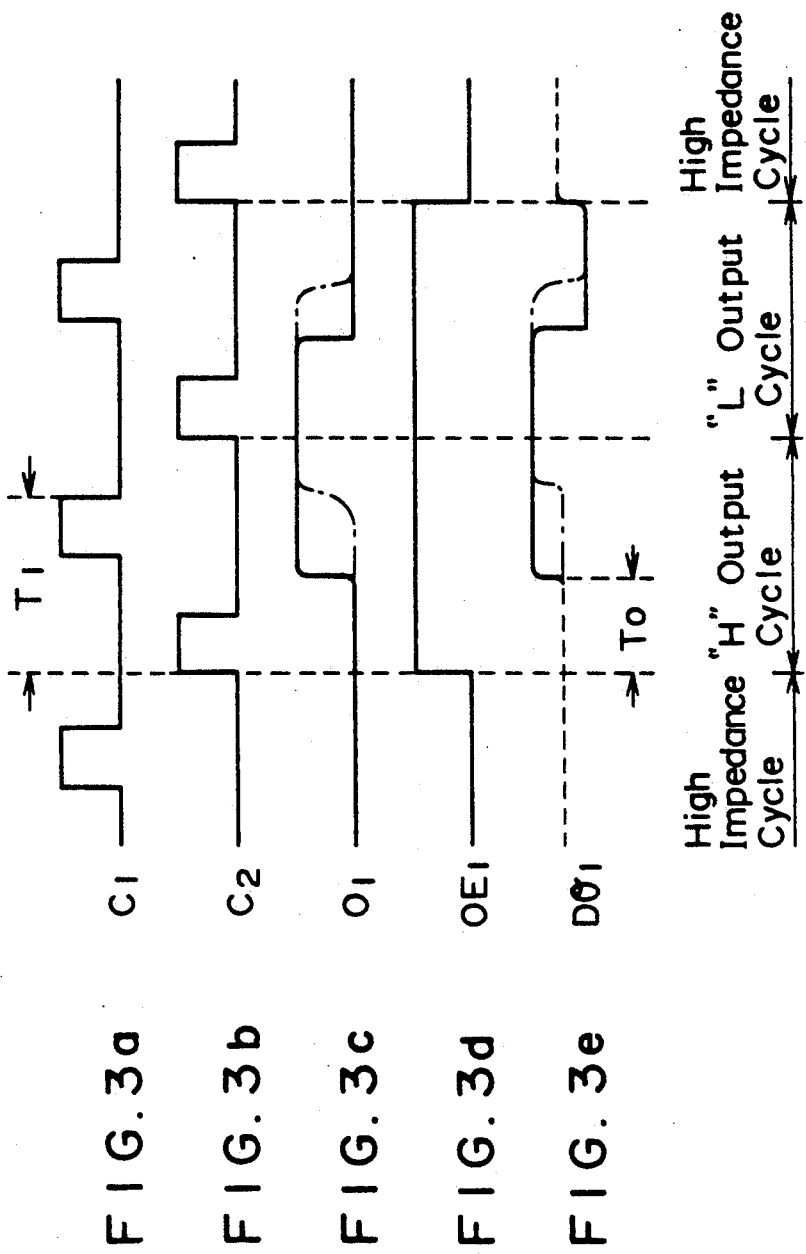

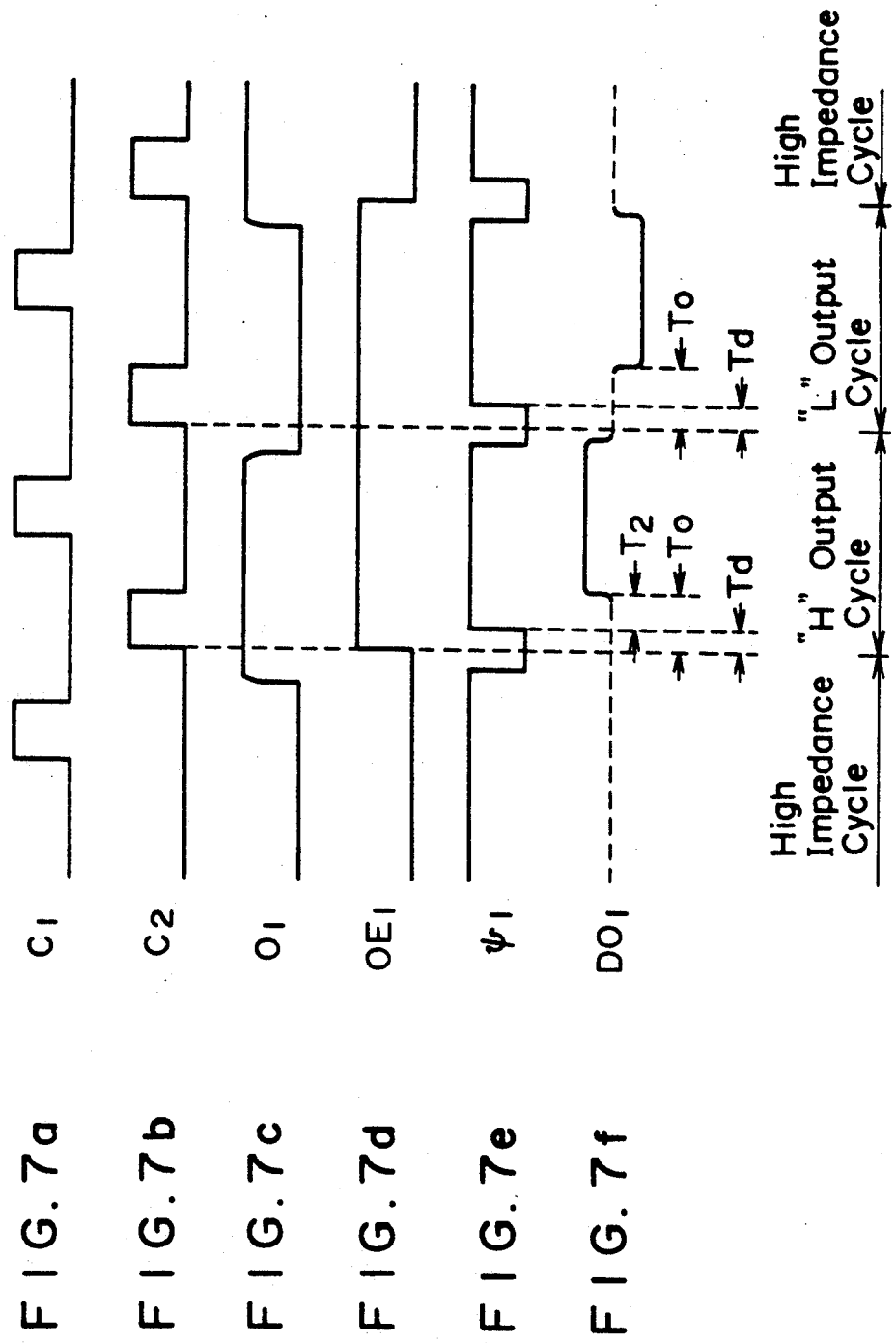

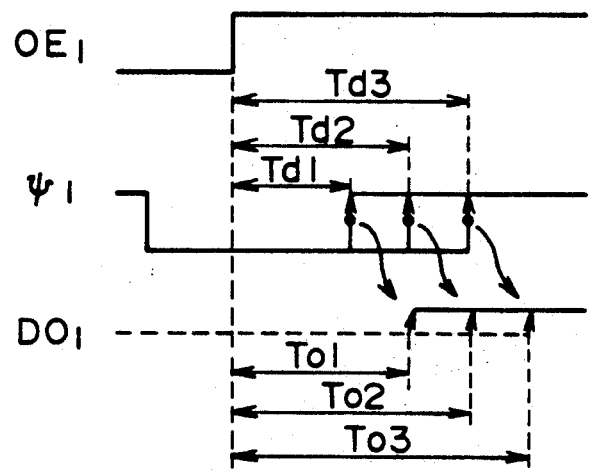
FIG. 8a OE₁
FIG. 8b ψ₁
FIG. 8c DO₁
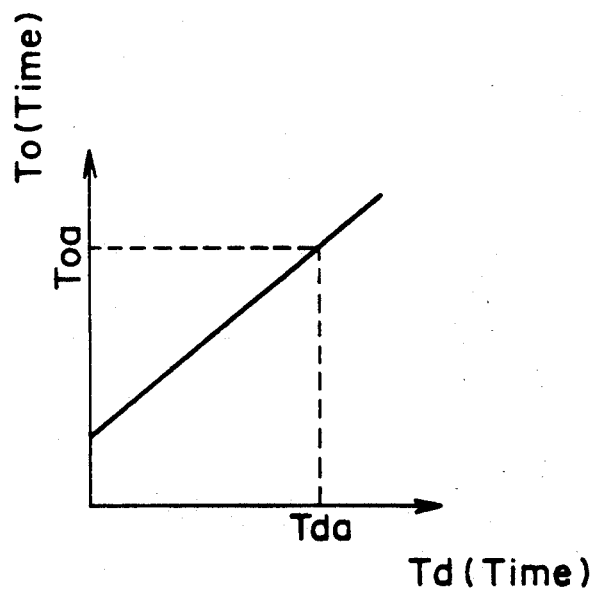
FIG. 9

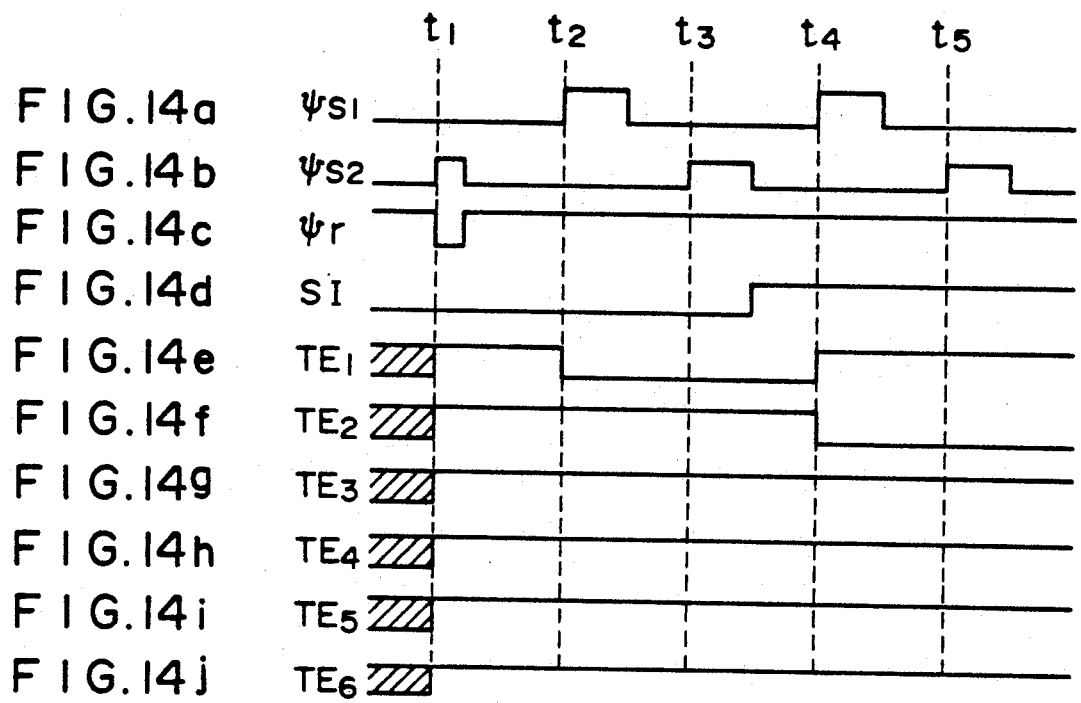
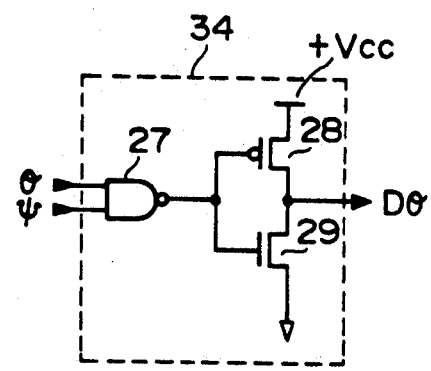
FIG. 15

F I G. 16
| ψ | θ | Dθ |
|---|---|----|
| L | L | L |
| L | H | L |
| H | L | L |
| H | H | H |
F I G. 17
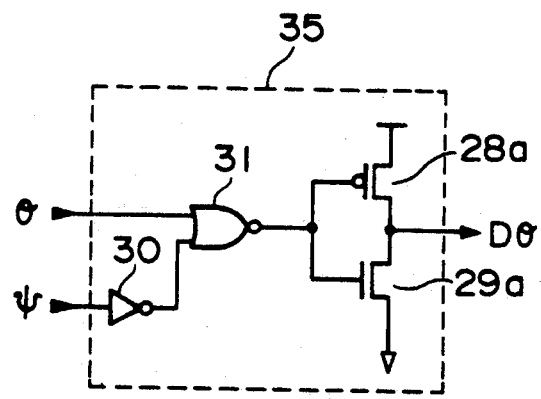
F I G. 18
| ψ | θ | Dθ |
|---|---|----|
| L | L | H |
| L | H | H |
| H | L | L |
| H | H | H |

FIG. 19
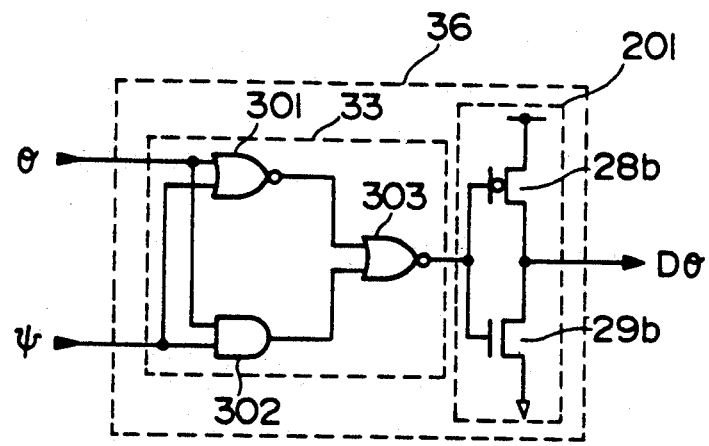
FIG. 20
| ψ | θ | Dθ |
|---|---|----|
| L | L | H |
| L | H | L |
| H | L | L |
| H | H | H |
FIG. 21
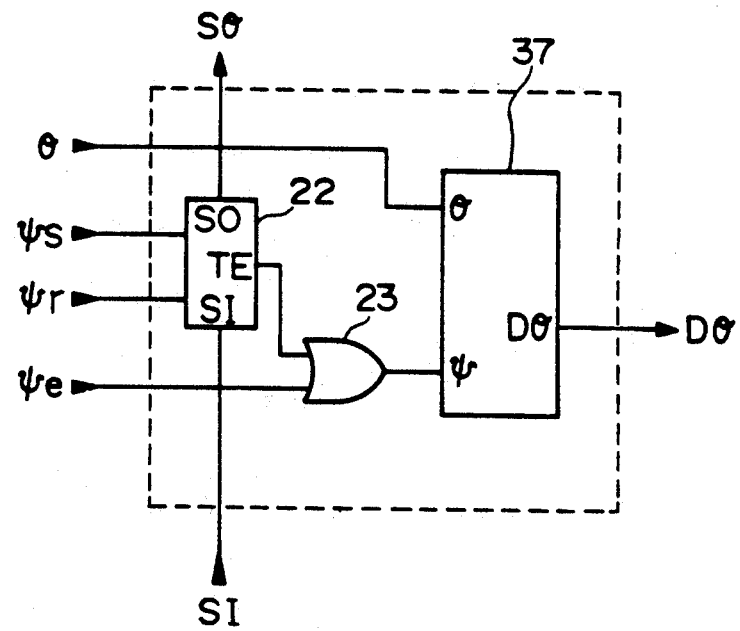

OUTPUT CIRCUIT WITH OUTPUT ENABLING INPUTS

BACKGROUND OF THE INVENTION

The present invention relates to an output circuit disposed within a semiconductor integrated circuit device, for outputting signals from other circuits within the integrated circuit device.

An example of conventional output circuits for a semiconductor integrated circuit device is shown in FIG. 1. The output circuit 1 comprises an output section 101 and a control section 102. The output section 101 includes a P-type MOSFET 5 and an N-type MOSFET 6 whose conduction paths are connected in series between a voltage supply $+V_{cc}$ and a point of ground potential. The junction of the conduction paths of the MOSFET's 5 and 6 provides an output node N1. The control section 102 comprises a NAND circuit 3 which has its output coupled to the gate of P-type MOSFET 5, and a NOR circuit 4 which has its output coupled to the gate of N-type MOSFET 6. An output control signal OE and an input signal O are supplied to NAND circuit 3, and an inverted version of the output control signal OE from an inverter 2 and the input signal O are supplied to NOR circuit 4. Output control signal OE and the input signal O are produced by other circuits within the semiconductor circuit device in which the output circuit 1 is disposed.

When output control signal OE is at a low (L) level, output node N1 exhibits a high impedance state, and when the output control signal OE is at a high (H) level, an output signal DO is developed at the same level as the input signal O, at the output node N1.

More specifically, when the output control signal OE is at the L level, the output signal from NAND circuit 3 is at the H level and, therefore, P-type MOSFET 5 is non-conductive, regardless of whether input signal O is at the H level or at the L level. At the same time, since an H level signal resulting from inverting the L level output control signal OE in the inverter 2 is applied to NOR circuit 4, the output signal from NOR circuit 4 is at the L level and, therefore, N-type MOSFET 6 is also non-conductive, regardless of whether the input signal O is at the H level or at the L level. Accordingly, a high impedance state is exhibited at output node N1.

Next, let it be assumed that the output control signal OE is at the H level and the input signal O is also at the H level. The output signal from the NAND circuit 3, to which both the output control signal OE and the input signal O are applied, is at the L level and, therefore, P-type MOSFET 5 is turned on. NOR circuit 4 receives the inverted version of the H level output control signal OE, which is at the L level, and the input signal O at the H level, and, accordingly, develops an output signal at the L level. Therefore, N-type MOSFET 6 is non-conductive. As a result, output node N1 is placed at the H level which is the same level as input signal O.

When the output control signal OE is at the H level and input signal O is at the L level, NAND circuit 3 develops an output signal at the H level and, therefore, P-type MOSFET 5 is non-conductive. NOR circuit 4 receives an L-level signal, which is the inverted version of the H level output control signal OE, and the L level input signal O. Accordingly, the output of NOR circuit 4 is at the H level so that N-type MOSFET 6 is conductive. Consequently, output node N1 is at the L level same as output signal O.

A circuit board 103 shown in FIG. 2 contains semiconductor integrated circuits 9 and 10 which may be a processor and a co-processor. Semiconductor integrated circuit 9 includes a logic circuit 7 and an output circuit 110, and semiconductor integrated circuit 10 includes a logic circuit 8 and an output circuit 120. The output circuit shown in FIG. 1 may serve as output circuits 110 and 120.

Logic circuit 7 includes a latch circuit 72 which couples a signal DO2 from output circuit 120 of semiconductor circuit 10 to a logic gate 71 when a H level clock signal $C_1$ is applied to latch circuit 72 from a clock signal generating circuit (not shown). Latch circuit 72 latches signal DO2 from output circuit 120 at the falling edge of clock signal $C_1$. Logic gate 71 performs an arithmetic operation on the signal applied thereto, and couples the result of the arithmetic operation to a latch circuit 73. Latch circuit 73 receives a clock signal $c_2$ from the clock signal generating circuit (not shown), and couples the output form logic gate 71 to a logic gate 74 when clock signal $C_2$ is at its H level. Latch circuit 73 latches the output from the logic gate 71 at the falling edge of the clock signal $C_2$. The logic gate 74 performs an arithmetic operation on the signal from the latch circuit 73 and couples the operation result to the output circuit 110 as an input signal 01 in synchronization with the rising edge of clock signal $C_2$. The logic circuit 7 also includes an output control signal generating circuit 75. When logic gate 74 is ready for providing the arithmetic operation result, the output control signal generating circuit 75 provides a H-level output control signal OE1 to output circuit 110 in synchronization with a rising edge of the clock signal $C_2$. After coupling the operation result from logic gate 71, output control signal generating circuit 75 restores output control signal OE1 to the L level in synchronization with the rising edge of clock signal $C_2$. (See FIGS. 3b and 3d.) Thus, output circuit 110 produces an output signal DO1 at the same level as the output signal 01 of the logic gate 74.

Similar to the logic circuit 7, the logic circuit 8 also includes a latch circuit 81, a logic gate 82, a latch circuit 83, a logic gate 84, and an output control signal generating circuit 85, and operates in a similar manner to logic circuit 7. Respective component circuits of logic circuit 8 develop signals similar to those which are generated by the corresponding component circuits of logic circuit 7.

Latch circuit 72, of the logic circuit 7, is coupled to output circuit 120 via a line 121 on board 103, and latch circuit 81 of logic circuit 8 is coupled to output circuit 110 via a line 122 on board 103.

For the correct operation of the semiconductor integrated circuits 9 and 10, a time period $T_0$ between the rising edge of the output control signal OE1, or the output control signal OE2 (from the output control signal generating circuit 85), and the occurrence of the output signal DO1, or the output signal DO2 (from output circuit 120), must be within a time period $T_1$ extending between the rising edge of clock signal $C_2$ and the falling edge of clock signal $C_1$, which occurs after the rising edge of signal $C_2$. In semiconductor integrated circuit 9, for example, the input signal 01, applied to the output circuit 110, is the result of the arithmetic operation performed by the logic gate 74 on the output of the latch circuit 73. Latch circuit 73 couples the result of the arithmetic operation performed by the logic gate 71 to the logic gate 74 in synchronization with the rising edge of clock signal $C_2$. Input signal 01 appears as output signal DO1 through output circuit 110. Accordingly, when the output control signal OE1 occurs in synchronization with the rising edge of clock signal $C_2$, there is a delay between the rising edge of the output control signal OE1 and the occurrence of the output signal DO1. The delay is provided by logic gate 74 and output circuit 110. If logic gate 74 provides a longer delay and, accordingly, input signal 01 and output signal DO1 are developed after clock signal $C_1$ changes to the L level, as indicated by dash-and-dot lines in FIGS. 3c and 3e, the output signal DO1 from output circuit 110 is not latched properly.

Accordingly, it is necessary to choose and place on circuit board 103 semiconductor integrated circuits 9 and 10 that can produce output signals DO1 and DO2 within time period $T_1$.

A reference time period is used for the selection of semiconductor integrated circuits suitable for use as circuits 9 and 10. This reference time period is such that if the output signals DO1 and DO2 are generated within the reference time period, those semiconductor integrated circuits which generate such output signals are judged to be acceptable, whereas those semiconductor integrated circuits which do not generate the output signals DO1 or DO2 within the reference time period are rejected. The reference time period is obtained by simulating circuits 9 and 10, and an arrangement and interconnections of semiconductor integrated circuits on circuit board 103.

It is difficult, however, to produce characteristic models of transistors in semiconductor integrated circuits 9, 10 and of signal transmission paths. Therefore, the precision of the simulated reference time period for selection is low. Accordingly, the reference time period used for selection of suitable semiconductor integrated circuits is formulated by adding a margin of error to the simulated or calculated reference time period. This produces such tight tolerances such that even acceptable semiconductor integrated circuits may be unnecessarily rejected.

OBJECTS AND SUMMARY OF THE INVENTION

Accordingly, it is an object of the invention to provide a highly precise reference time period for selecting acceptable semiconductor integrated circuits.

It is a further object of this invention to provide a highly precise reference time period with respect to each of a plurality of output signals. Briefly stated, an output circuit for a semiconductor integrated circuit, includes output means to which an input signal in a first or second state is applied and which develops an output signal in accordance with the input signal. Control means controls the timing of occurrence of the output signal in response to a control signal which is delayed from a reference signal.

According to a feature of the invention, output means is provided, which receives an input signal in a first or second state and develops an output in accordance with this input signal. Storage means stores a first control signal which can assume either a first state or a second state. Control means receives a first control signal stored in the storage means and also a second control signal which can assume either a first state or a second state. The control means, with the first control signal in the first state being applied thereto, controls the timing of occurrence of the output signal from the output means in accordance with a transition of the second control signal from the first state to the second state.

BRIEF DESCRIPTION OF THE DRAWINGS

FIG. 1 is a circuit diagram of a conventional output circuit for a semiconductor integrated circuit.

FIGS. 3a-3e show waveforms for use in explaining the operation in the output circuits of FIG. 2.

FIG. 4 is a circuit diagram of an output circuit according to a first embodiment of the present invention.

FIG. 5 shows a truth table for output circuit of FIG. 4.

FIGS. 7a-7f show waveforms for use in explaining the operation of the circuits of FIG. 6.

FIGS. 8a-8c show a timing relation of an output control signal, a control signal, and an output signal in the output circuit shown in FIG. 4.

FIG. 9 shows the relationship between a control signal delay and an output signal delay in the output circuit of FIG. 4.

FIGS. 14a-14j show waveforms for explaining the operation of the shift register of FIG. 12.

FIG. 15 is a circuit diagram of an output circuit according to a third embodiment of the present invention.

FIG. 16 is a truth table for the output circuit of FIG. 15.

FIG. 17 is a circuit diagram of an output circuit according to a fourth embodiment of the present invention.

FIG. 18 is a truth table for the output circuit shown in FIG. 17.

FIG. 19 is a circuit diagram of an output circuit according to a fifth embodiment of the present invention.

FIG. 20 is a truth table for the output circuit shown in FIG. 19.

FIG. 21 is a circuit diagram of an output circuit according to a sixth embodiment of the present invention.

DETAILED DESCRIPTION OF THE PREFERRED EMBODIMENTS

Embodiment 1

Figure 2:
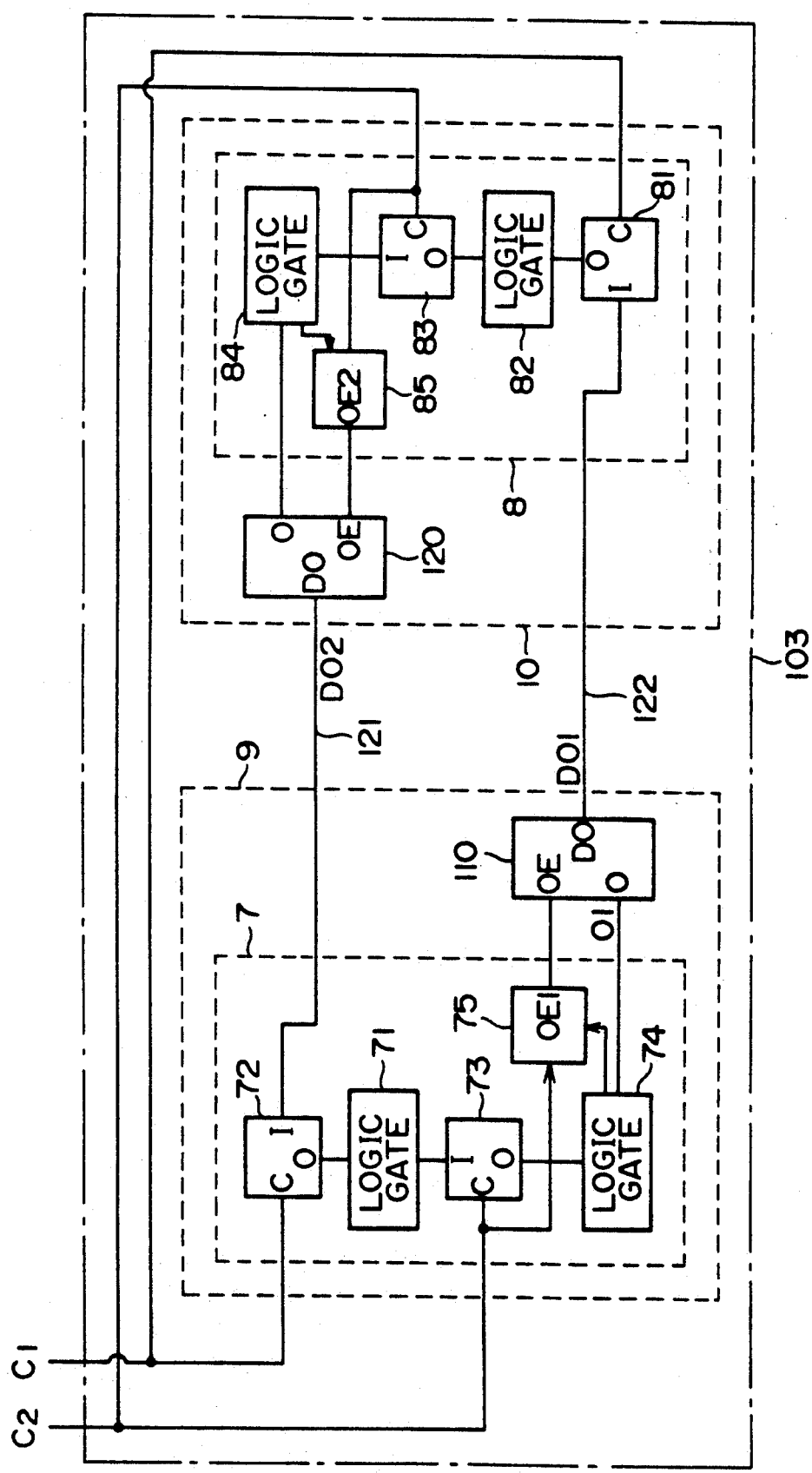
FIG. 2 shows semiconductor integrated circuits with the output circuits of FIG. 1 incorporated therein.

Referring to FIG. 4, an output circuit 11 according to a first embodiment of the present invention is shown. Output circuit 11 comprises an output section 201 and a control section 202. Output section 201, like output section 101 of the conventional output circuit shown in FIG. 1, includes a P-type MOSFET 16 and an N-type MOSFET 17 whose conduction paths are connected in series between a voltage supply $+V_{cc}$ and a point of ground potential. An output node N1 is located at the junction of the conduction paths of the two MOSFET's 16 and 17.

Control section 202 includes a NAND circuit 14 which provides an output to the gate of P-type MOSFET 16. NAND circuit 14 receives an output signal from a NAND circuit 12 inverted by an inverter 13, and also an input signal O. NAND circuit 12 receives an output control signal OE and a control signal $\Psi$.

N-type MOSFET 17 receives, at its gate, an output signal from a NOR circuit 15. NOR circuit 15 receives the output signal of the NAND circuit 12 and the input signal O.

With control signal $\Psi$ at the L level, the output signal of NAND circuit 12 is at the H level regardless of whether the output control signal OE is at the H level or L level. The output of NAND circuit 12 is inverted by inverter 13 and, then, applied to NAND circuit 14. Therefore, the output signal of NAND circuit 14 is at the H level regardless of whether the input signal O is at the H level or L level. This causes P-type MOSFET 16 to be non-conductive. Furthermore, since the output signal at the H level from NAND circuit 12 is applied to NOR circuit 15, the output signal of NOR circuit 15 is at the L level regardless of whether the input signal O is at the H level or L level. As a result, N-type MOSFET 17 is non-conductive. Thus, the output node N1 is in a high impedance state, because both MOSFET's 16 and 17 are non-conductive.

When the control signal $\Psi$ is at the H level and the output control signal OE is at the L level, the output of the NAND circuit 12 is at the H level so that, as in the above-described situation, the output node N1 is in the high impedance state.

With both the control signal $\Psi$ and the output control signal OE are at H level, the output signal of the NAND circuit 12 is at the L level, which is inverted by inverter 13 and applied to NAND circuit 14. The L level output signal from NAND circuit 12 is applied to NOR circuit 15. Consequently, an output signal DO in accordance with the level of the input signal O is produced. For instance, when the input signal O is at the H level, NAND circuit 14 produces an output signal at the L level and NOR circuit 15 produces an output signal at L level, which caused the P-type MOSFET 16 and the N-type MOSFET 17 to be turned on and off, respectively. Accordingly, the H level output signal DO is produced. When input signal O is at the L level, the output signal of NAND circuit 14 is at the H level and the output signal of NOR circuit 15 is at the H level. Consequently, P-type MOSFET 16 is non-conductive, while N-type MOSFET 17 is conductive, so the output signal DO is produced at the L level.

The relation of the output control signal OE, the control signal $\Psi$, the input signal O, and the output signal DO is shown in FIG. 5.

Figure 6:
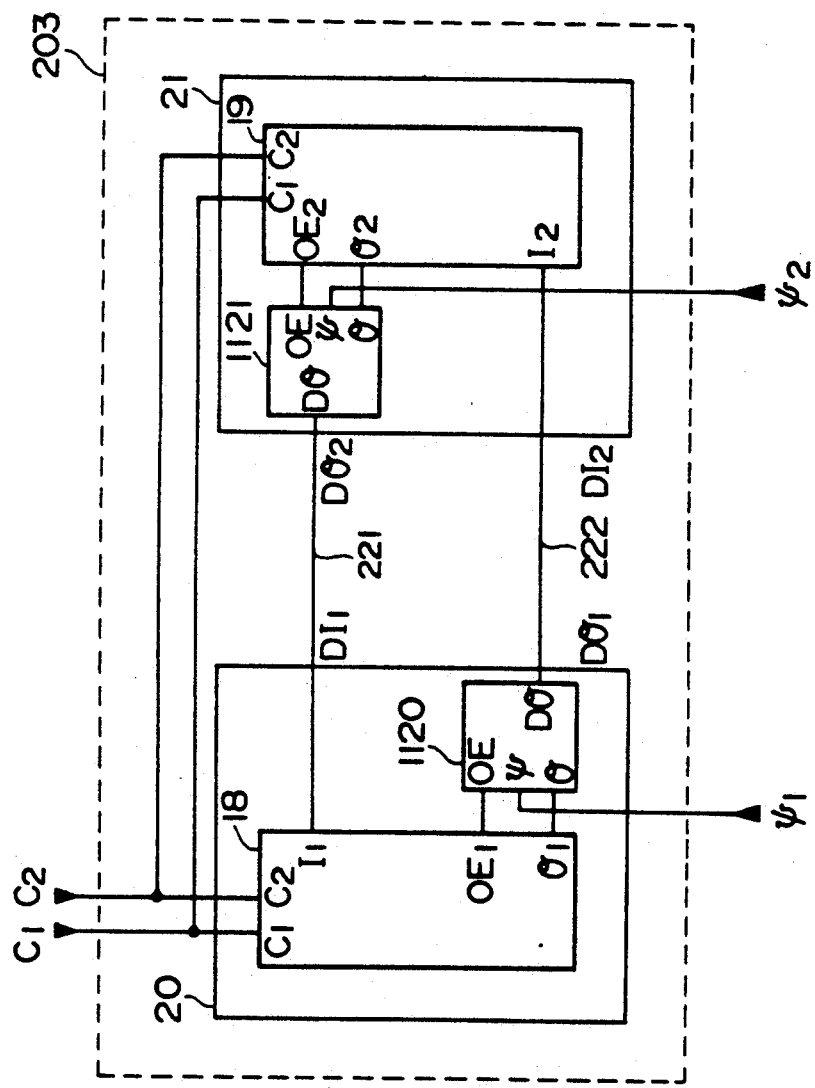
FIG. 6 shows semiconductor integrated circuits, including the output circuits of FIG. 4.

Output circuit 11 shown in FIG. 4 may be used as each of output circuits 1120 and 1121 shown in FIG. 6. Output circuits 1120 and 1121 and logic circuits 18 and 19 form semiconductor integrated circuits 20 and 21, respectively. Logic circuits 18 and 19 have configurations similar to logic circuits 7 and 8 shown in FIG. 2. Semiconductor integrated circuits 20 and 21 are disposed on a board 203, with output circuit 1120 connected via a line 222 to a latch circuit (corresponding to the latch circuit 81 of FIG. 2) in logic circuit 19. Output circuit 1121 is connected to a latch circuit (corresponding to the latch circuit 72 of FIG. 2) in logic circuit 18 by line 221. In practical use, semiconductor integrated circuits 20 and 21, control signals $\Psi_1$ and $\Psi_2$ (which correspond to the control signal $\Psi$ in FIG. 5) which are applied to output circuit 1120 and 1121, are placed at the H level. With this arrangement, as in output circuits 110 and 120 shown in FIG. 2, output signals DO1 and DO2 are at a high impedance state when output control signals OE1 and OE2 are at the L level, the output signals DO1 and DO2 are at the L level when the output control signals OE1 and OE2 are at the H level and the input signal O is at the L level, and the output signals DO1 and DO2 are at the H level when the output control signals OE1 and OE2 are at the H level and the input signal is at the H level.

Varying the time when the control signal $\Psi_1$ or $\Psi_2$ changes from the L level to the H level, a time period To form the rising edge of the output control signal OE1 or OE2 to the occurrence of the output signal DO1 or DO2 from the output circuit 1120 or 1121 (illustrated in FIGS. 7d and 7f) can be varied. Taking advantage of this fact, it is possible to determine a reference time period T for selecting acceptable semiconductor integrated circuits which can be used as semiconductor integrated circuits 20 or 21, from a plurality of mass-produced semiconductor integrated circuits.

In the semiconductor integrated circuit 20, for example, as shown in FIGS. 7b and 7d, the output control signal OE1 rises at the time when clock signal $C_2$ rises, and the output circuit 1120 develops the output signal DO1, in response to the output signal O1 of logic circuit 18, with a time delay T2 after the rising edge of control signal $\Psi_1$ which occurs after rising of the output control signal OE1. (See FIGS. 7b–7f.) The delay time T2 varies for different semiconductor integrated circuits. Similar to the previously described conventional circuit, the generation of the output signal DO1 must be before the falling edge of clock signal $C_1$. In practical use of semiconductor integrated circuit 20, control signal $\Psi_1$ is placed at the H level. Accordingly, the output signal DO1 is generated with a particular delay time T2 of semiconductor integrated circuit 20 after the output control signal OE1 rises. A semiconductor integrated circuit will be judged acceptable if the occurrence of output signal DO1 is before the rising edge of clock signal $C_2$. To determine whether a particular semiconductor integrated circuit can be accepted or rejected, it is necessary to determine the length of the delay time T2 and to compare it with a reference time period T. If delay time T2 of a particular semiconductor integrated circuit is longer than the reference time period T, the integrated circuit should be rejected.

This reference time period T is determined in the following manner. Referring to FIGS. 8a and 8b, by varying a time Td from the rising edge of the clock signal $C_2$ and, hence, from the rising edge of the output control signal OE1 to the rising edge of the control signal $\Psi_1$, to, for example, Td1, Td2 or Td3, as shown, the time between the rising edge of the output control signal OE1 and the occurrence of the output signal DO1 can also be varied to, for example, To1, To2, or To3, respectively. The control signal $\Psi$, having a rising edge variable in time of occurrence may be produced by a commercially available tester having such a function.

A graph, like the one shown in FIG. 9 is prepared by measuring delay times Td and To of one of mass-produced semiconductor integrated circuits 20, for example the circuit having delay times with the fastest operation speed. Then, semiconductor integrated circuit 20 and a randomly selected one of semiconductor integrated circuits designed for use as circuit 21 are disposed on board 203. While the two circuits are operated, the timing of the rising edge of control signal Ψ, is varied and the output signal DO2 from the circuit 21 is monitored by means of the tester, to determine a critical value Tda of delay time Td required by the semiconductor integrated circuits 20 and 21 for their normal operation. The expected state and value of output signal DO2, of the semiconductor integrated circuit 21, assumes are known from the simulation. Accordingly, the value of Td, at which the output signal DO2 assumes a value different from the expected value it should assume is the critical value Tda.

The critical value Tda is measured for a plurality of different semiconductor output circuits used as circuit 21, to obtain a plurality of Tda values. These Tda's are averaged, and Toa for the average value of Tda's is determined from the graph in FIG. 9. The determined value of Toa is the critical delay time from the rising edge of the output control signal Ψ, to the occurrence of the output signal DO1, required by semiconductor integrated circuit 20. The value obtained by subtracting a margin of error (e.g. a value equal to three times the standard deviation of the values of Tda's) from this critical value of Toa is used as the reference time period T for selecting semiconductor integrated circuits suitable for circuit 20.

Control signal Ψ, at the H level, clock signals $C_1$ and $C_2$, and the input signal DI1 are applied to each of semiconductor integrated circuits designed for use as the circuit 20 to measure the delay time To generated in that circuit. If the delay time To generated in that circuit. If the delay time To is shorter than the reference time period T, that integrated circuit is acceptable for use as semiconductor integrated circuit 20.

In a similar manner, the reference time period T for selecting acceptable semiconductor integrated circuits for circuit 21 is determined, and, using the determined reference time period T, acceptable circuits for semiconductor integrated circuit 21 are selected.

Embodiment 2

For a semiconductor integrated circuit including a plurality of output circuits, a control signal Ψ like the one used in the first embodiment is prepared for respective output circuits, which, undesirably increases the number of terminals. The second embodiment shown in FIG. 10 solves this problem.

Figure 10:
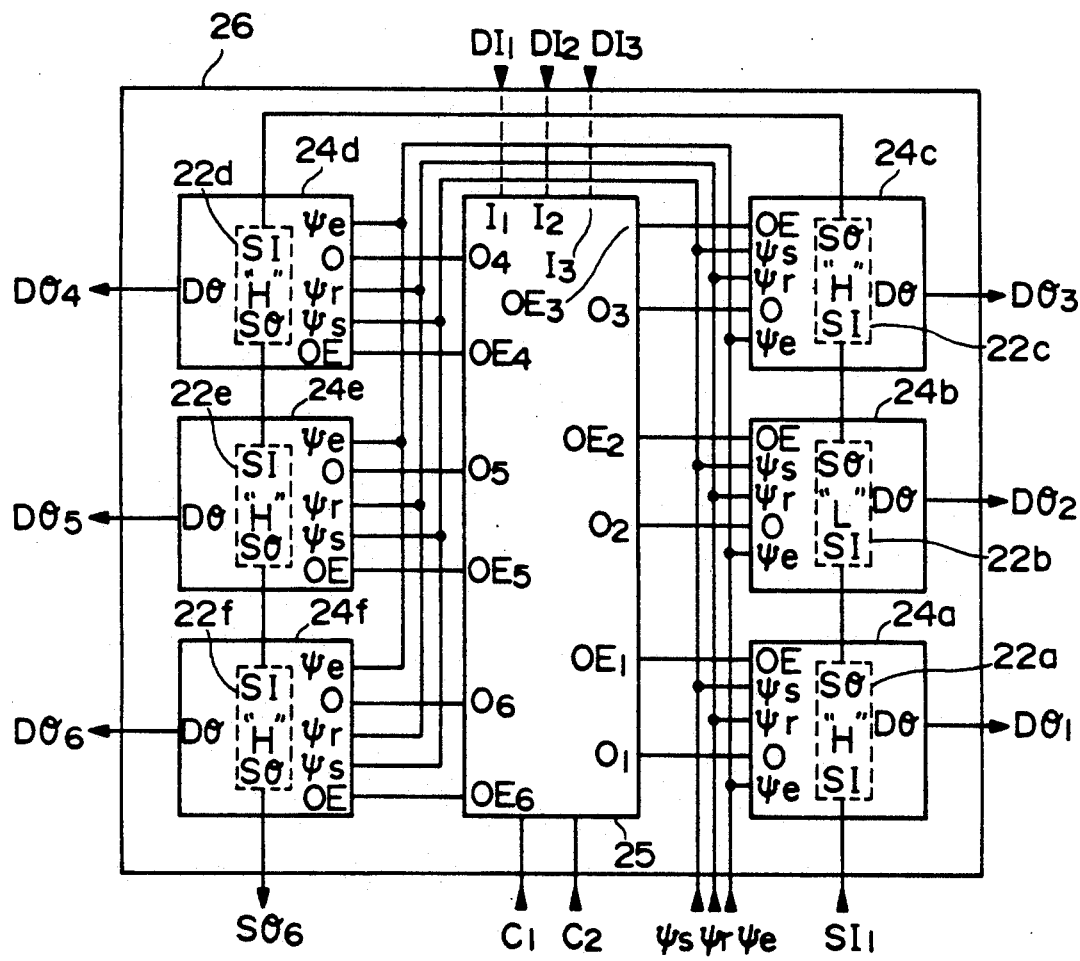
FIG. 10 is a block diagram of semiconductor integrated circuits including output circuits according to a second embodiment of the present invention.

In FIG. 10, a semiconductor integrated circuit 26 may be a logic LSI, such as a processor. The circuit 26 includes output circuits 24a-24f. Storage sections 22a-22f of this embodiment may be any storage means that functions to temporarily hold a signal and a function and to transfer and output the held signal. In this embodiment, a shift register can be used as the storage section. Each of output circuits 24a-24f receives an output control signal OE, a first input signal O1-O6, a shift register reset signal Ψr, a shift register shift signal Ψs for shifting a signal SI1 applied to a shift register input terminal successively through the storage sections 22a-22f, and a control signal Ψe. The semiconductor integrated circuit 26 includes also a logic circuit 25 which operates on clock signals $C_1$ and $C_2$ and provides, in response to input signals DI1-DI3, output control signals OE1-OE6 and first input signals O1-O6 for respective output circuits 24a-24f. The logic circuit 25 is similar to the logic circuit 18 or 19 in the first embodiment.

Figure 11:
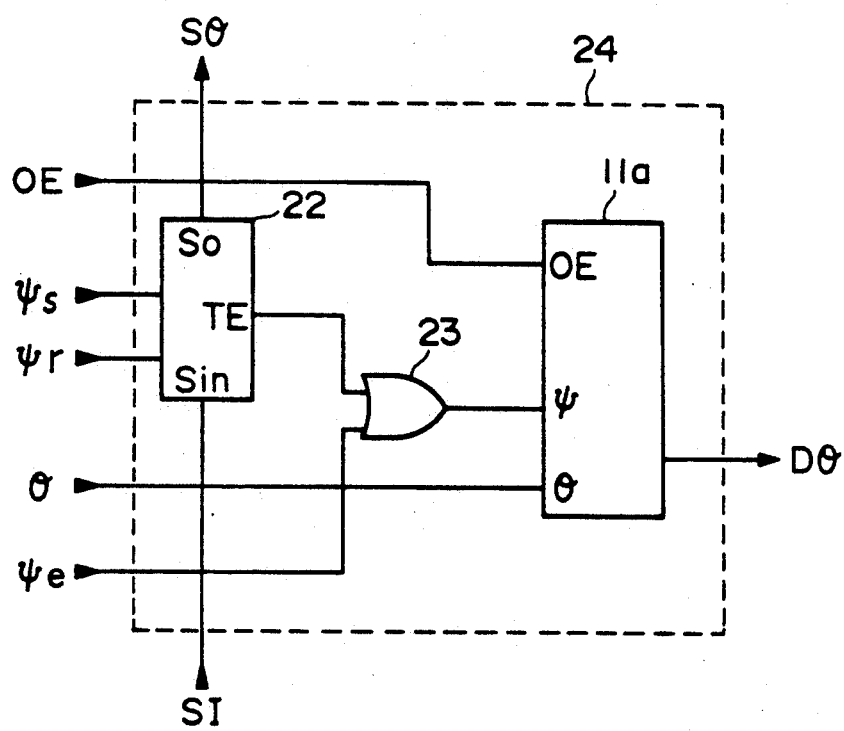
FIG. 11 is a block diagram of one of the output circuits according to the second embodiment shown in FIG. 10.

Each of the output circuits 24a-24f has the same configuration as an output circuit 24 shown in FIG. 11. Output circuit 24 includes a shift register stage 22 which receives a shift register shift signal Ψs (practically comprising two signals Ψs1 and Ψs2), a shift register reset signal Ψr, and a shift register input signal SI. The output circuit 24 also includes an OR circuit 23 which receives an output TE of shift register stage 22 and a control signal Ψe, and an output stage 11a, similar to the circuit 11 shown in FIG. 4, which receives an output control signal OE, an output of OR circuit 23, and an input signal O.

In output circuit 24 shown in FIG. 11, when reset signal Ψr is applied to shift register stage 22, the data held therein is reset to the H level and shift register stage 22 develops an "H" signal at its terminal TE. OR gate 23 receiving the "H" signal at its input develops an "H" output regardless of the state of the control signal Ψe. Thus, an output signal DO, according to input signal O, is developed at the output node of output stage 11a. The output circuit 24 is usually used with this signal condition.

When the input signal SI, at the "L" level, and shift signal Ψs are applied to shift register stage 22, the data held by register stage 22 changes to "L" level, and is developed at terminal TE. With this "L" signal being applied to one input, the output from OR gate 23 is dependent on control signal Ψe applied to the other input of OR gate 23. Thus, the timing at which the output signal DO is developed at the output node, in response to the input signal O, can be controlled by the control signal Ψe. Output circuit 24 is used with this signal condition for measuring the previously described reference time period T for selection of acceptable semiconductor integrated circuits. Output stage 11a is placed in the same state as output circuit 11, shown in FIG. 4, which allows determination of the selection reference time period T, as is with output circuit 11 of FIG. 4.

Figure 13:
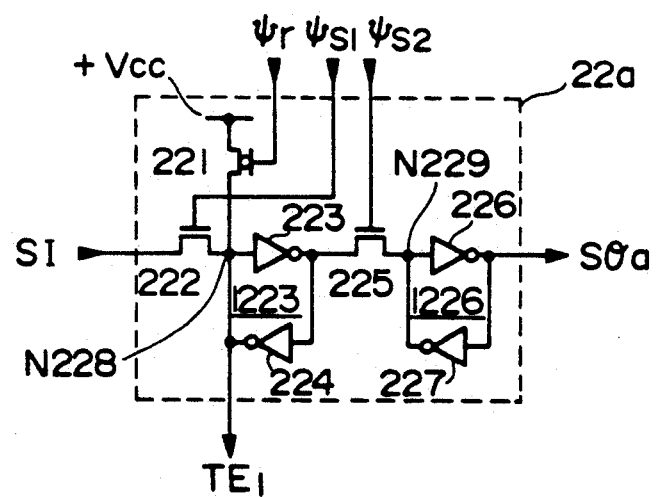
FIG. 13 is a circuit diagram of one of the shift register stages shown in FIG. 12.
Figure 12:
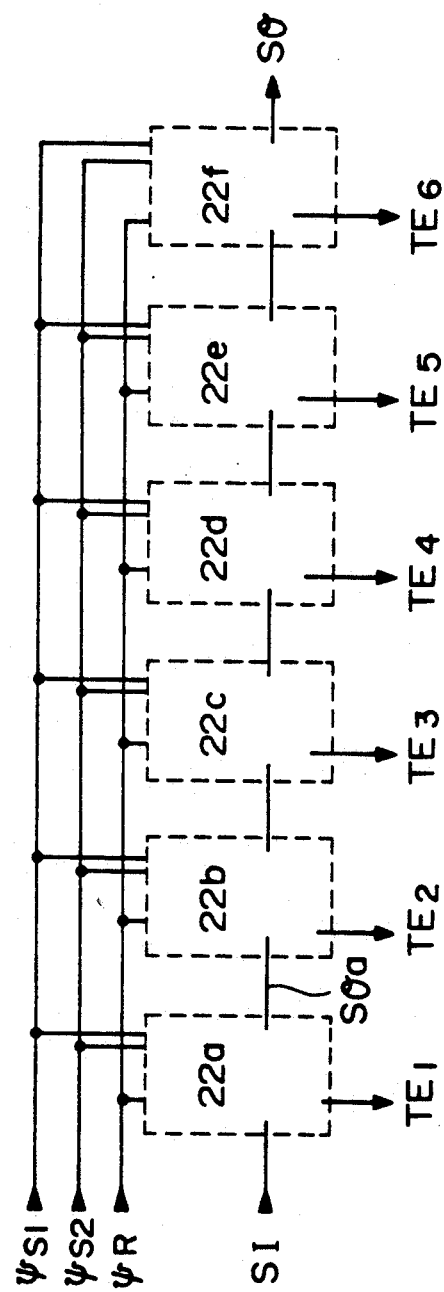
FIG. 12 is a block diagram of a shift register having shift register stages included in respective ones of the output circuits shown in FIG. 11.

An example of the shift register (22a-22f) shown in FIG. 10 is shown in detail in FIG. 12, and an example of the shift register stage shown in FIG. 11 is shown in detail in FIG. 13. In FIG. 12, the shift register stage 22a receives the shift register input signal SI, the shift register shift signals Ψs1 and Ψs2, and the shift register reset signal Ψr. The shift register stage 22b receives the output signal SOa from the shift register stage 22a, the shift register shift signals Ψs1 and Ψs2, and the shift register reset signal Ψr. The shift register stages 22c-22f are of the same configuration as the shift register stage 22b. Accordingly, shift register stages 22c-22f receive output signals from preceding stages, the shift register shift signals Ψs1 and Ψs2, and the shift register reset signal Ψr. The details of shift register stage 22a of FIG. 12 are shown in FIG. 13. In FIG. 13, shift register stage 22a includes a first latch 1223 having inverters 223 and 224. The input of inverter 223 is connected to the output of inverter 224 at a circuit node N228. A second latch 1226 includes inverters 226 and 227. The input of inverter 226 is connected to the output of the inverter 227 at a circuit node N229. An N-type MOSFET 222 is connected between the terminal receiving shift register input signal SI, first latch 1223, and receives shift register shift signal Ψs1 at its gate. An N-type MOSFET 225 is connected between first and second latches 1223 and 1226, and receives shift register shift signal Ψs2 at its gate. Finally, a P-type MOSFET 221 is connected between a +Vcc voltage supply and node N228, it receives shift register reset signal Ψr at its gate. The other shift register stages 22b-22f have configuration similar to the shift register stage 22a of FIG. 13.

The operation of the shift register stage 22a is as follows. For initialization, the shift register reset signal Ψr and the shift register shift signal Ψs2 are placed at the L and H levels, respectively, which places nodes N228 and N229 at the H and L levels.

To make the shift register stage 22a hold an L-level signal, shift register input signal SI, at the L level, and shift register shift signal Ψs1, at the H level, are applied so that node N228 is placed at the H level. Then, shift register shift signal Ψs2 is placed at the H level to set node N229 to "H", so shift register stage 22a is ready to receive subsequent data and to provide an output to the succeeding stage.

To hold the "H" level in shift register stage 22a, stage 22 is operates in subsequently the same manner as stated above for holding the "L" level, except that the level of shift register input signal SI applied to shift register stage 22a is at the H level.

Next, with reference to FIGS. 14a-14j, storing "H", "L", "H", "H", "H", and "H" in shift register stages 22a-22f, respectively, is explained. First, at time t1, shift register reset signal Ψr and shift register shift signal Ψs2 are placed respectively at the L and H levels to initialize the shift register stages 22a-22f to hold "H". Next, at a time t2, shift register shift signal Ψs1 is placed at "H" to cause shift register stage 22a to take in data "L" of shift register input signal SI. At a time t3, shift register shift signal Ψs2 is made "H", and at a time t4, shift register shift signal Ψs1 is made "H", whereby shift register stage 22a takes in the "H" data of shift register input signal SI and, at the same time, the "L" data in shift register stage 22a is shifted to shift register stage 22b. At this time, the data held in the respective shift register stages 22b-22f are shifted rightward. In this manner the data "H", "L", "H", "H", "H", and "H" are set in shift register stages 22a-22f, respectively.

Next, how to determine a reference time period T for selecting acceptable semiconductor integrated circuits for circuit 26 is explained in terms of, for example, output signal DO2 from output circuit 24b.

In order for the output signal DO2, from the output circuit 24b, out of output circuits 24a-24f, to become capable of being controlled as desired with control signal Ψe, when shift register stages 22a-22f are set to the states "H", "L", "H", "H", "H", and "H", respectively, in the manner described above.

Then in the manner followed in Embodiment 1, the timing of occurrence of output signal DO2 from output circuit 24b is varied by means of control signal Ψe, to determine the selection reference time period T for semiconductor integrated circuit 26. Furthermore, by varying the setting of shift register stages 22a-22f, the selection reference time period T for any of the output circuits can be determined. For example, when output signals DO3 and DO4 must occur simultaneously from respective output circuits 24c and 24d, their selection reference time periods need not be determined separately. In this case, shift register stages 22a-22f are set to the states "H", "H", "L", "L", "H", and "H" respectively.

Embodiment 3

FIG. 15 shows an output circuit 34 according to a third embodiment of the present invention. The output circuit 34 includes NAND circuit 27 which receives an input signal O and a control signal Ψ. The output from NAND circuit 27 is coupled to the respective gates of a P-type MOSFET 28 and an N-type MOSFET 29. The P-type and N-type MOSFET's 28 and 29 have their conduction paths connected in series between a +Vcc node and a ground node. An output node is provided at the junction of the conduction paths of MOSFET's 28 and 29. The relation of input signal O, control signal Ψ, and output signal DO in this output circuit 34 is shown in FIG. 16.

For normal use of the output circuit 34, the control signal Ψ is fixed to the H level, so the output circuit 34 develops the output signal DO, which depends on the input signal O. Thus, the output signal DO is never placed in a high impedance state. For determining the reference time period T for selecting acceptable semiconductor integrated circuits, the occurrence of a transition of control signal Ψ from the L level to the H level is delayed relative to the rising edge of clock signal C2. In this case, the timing of transition from "L" to "H" of output signal DO can be controlled as desired by means of control signal Ψ. Thus, in a manner similar to the one explained with reference to the first embodiment, the selection reference time T is determined for the semiconductor integrated circuit, including an output circuit having the same configuration as the output circuit 34, shown in FIG. 15.

Embodiment 4

FIG. 17 shows another output circuit 35 according to a fourth embodiment of the present invention. The output circuit 35 includes a P-type MOSFET 28a and an N-type MOSFET 29a connected in a similar manner to the MOSFET's 28 and 29 in FIG. 15. The gates of MOSFET's 28a and 29a receive an output from NOR circuit 31 which, in turn, receives an input signal O and an inverted version of a control signal Ψ from an inverter 30. The relation of the input signal O, the control signal Ψ, and an output signal DO of output circuit 35 is shown in FIG. 18.

For normal use of output circuit 35, control signal Ψ is fixed to "H", so output circuit 35 develops output signal DO which is dependent on the input signal O. The occurrence of transition from "L" to "H" of control signal Ψ is delayed relative to the rising edge of clock signal C2 when output circuit 35 is used to determine reference time period T for selecting acceptable semiconductor integrated circuits which include an output circuit having the same configuration as shown in FIG. 17, and to which clock signals C1 and C2 are applied, as in circuit 20 shown in FIG. 6. The timing of occurrence of a transition from "H" to "L" of output signal DO can be controlled as desired by means of control signal Ψ. Thus, in a manner as explained with reference to the first embodiment, selection reference time period T can be determined.

Embodiment 5

FIG. 19 shows an output circuit 36 according to a fifth embodiment of the present invention. Output circuit 36 includes P-type and N-type MOSFET's 28b and 29b connected in a similar way to the MOSFET's 28 and 29 of FIG. 15. Respective gates of MOSFET's 28b and 29b receive an output from an exclusive OR circuit 33. Exclusive OR circuit 33 includes a NOR circuit 301 and an AND circuit 302, both receive an input signal O and a control signal Ψ. NOR circuit 303 receives outputs from circuits 301 and 302. The output of NOR circuit 303 is coupled to the gates of MOSFET's 28b and 29b. The relation of the input signal O, the control signal Ψ, and an output signal DO of the output circuit 36 is shown in FIG. 20.

For normal use of output circuit 36, the control signal is fixed to the H level. Output circuit 36 develops output signal DO depending on the input signal O.

The occurrence of transition from "L" to "H" of control signal Ψ is delayed relative to the rising edge of clock signal $C_2$ when output signal 36 is used to determine selection reference time period T for a semiconductor integrated circuit, which includes an output circuit similar in configuration to output circuit 36 shown in FIG. 19, and to which clock signals $C_1$ and $C_2$ are applied, as in circuit 20 shown in FIG. 6. The timing of transition from "L" to "H" of the output signal DO can be controlled as desired by means of the control signal Ψ. Thus, reference time period T for selecting acceptable semiconductor integrated circuits, including an output circuit 36, as shown in FIG. 19, can be determined in a manner similar to the one explained with reference to the first embodiment.

Embodiment 6

FIG. 21 shows an output circuit according to a sixth embodiment of the present invention. This output circuit is designed such that a plurality of such output circuits are to be used in a semiconductor integrated circuit, as in the second embodiment shown in FIG. 10. This output circuit includes a circuit 37 having the same configuration as the output circuits 34, 35 or 36 shown in FIGS. 15, 17 or 19. Circuit 37 receives an input signal O, and a control signal Ψ from an OR circuit 23. OR circuit 23 receives a control signal Ψe and an output signal TE of a shift register stage 22. Shift register stage 22 is similar to shift register stage 22a used in the second embodiment circuit shown in FIG. 10.

Reference time period T, for selecting acceptable semiconductor integrated circuits, including an output circuit having the same configuration as the one shown in FIG. 21, can be determined by setting shift register stage 22 to "L" or "H".

Embodiment 7

Figure 22:
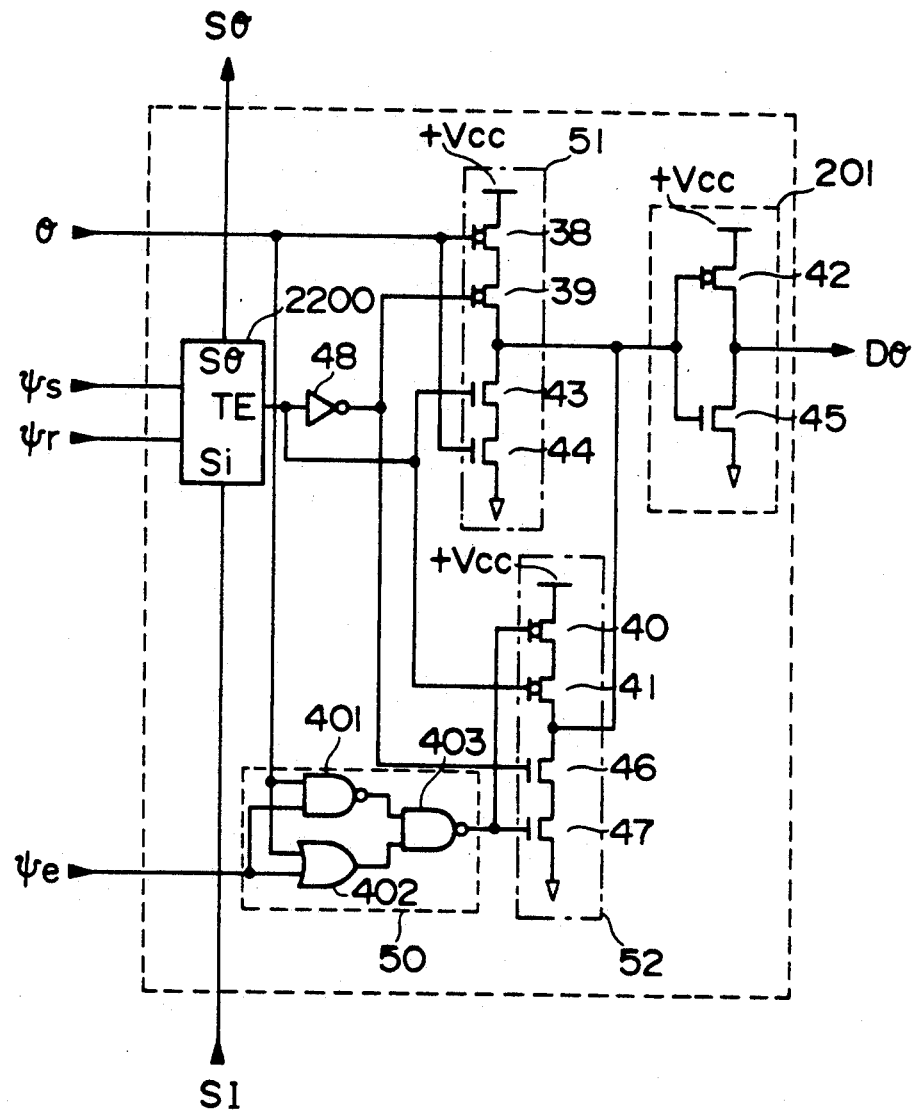
FIG. 22 is a circuit diagram of an output circuit according to a seventh embodiment of the present invention.

FIG. 22 shows an output circuit according to a seventh embodiment of the present invention. This output circuit is designed such that a plurality of such output circuits are used in a single semiconductor integrated circuit, as in the second embodiment shown in FIG. 10. The output circuit includes an output section 201 which comprises a P-type MOSFET 42 and an N-type MOSFET 45 having their conduction paths connected in series between $+V_{cc}$ and a ground.

The respective gates of MOSFET's 42 and 45 receive output signals from buffer circuits 51 and 52. Buffer circuit 51 comprises P-type MOSFET's 38 and 39 and N-type MOSFET's 43 and 44 connected in the named order from $+V_{cc}$ to ground with their conduction paths connected in series. Similarly, the buffer circuit 52 comprises P-type MOSFET's 40 and 41 and N-type MOSFET's 46 and 47 connected in the named order from $+V_{cc}$ to ground with their conduction paths connected in series.

The respective gates of the P-type MOSFET 38 and the N-type MOSFET 44 of the buffer circuit 51 receive an input signal O. The gate of the N-type MOSFET 43 receives an output signal TE of a shift register stage 2200 inverted by an inverter 48.

Output signal TE of shift register state 2200 is also coupled to the gate of P-type MOSFET 41. Output signal TE is inverted by inverter 48 and coupled to the gate of N-type MOSFET 46. The respective gates of P-type MOSFET 40 and N-type MOSFET 47 receive an output signal of an exclusive NOR circuit 50. The exclusive NOR circuit 50 comprises NAND circuits 401 and 403, and an OR circuit 402. The exclusive NOR circuit 50 receives an input signal O and a control signal Ψe.

Shift register stage 2200 has the same configuration as stage 22 shown in FIG. 20. Shift register stage 2200 receives a shift register shift control signal Ψs, a shift register reset signal Ψr, and an input signal SI, and produces the output signals TE and SO.

In operation, when the shift register stage is holding "H" (TE="H"), the output of inverter 48 is at the L level. Accordingly, P-type MOSFET 39 and N-type MOSFET 43 are conductive, whereas P-type MOSFET 41 and N-type MOSFET 46 are non-conductive. Therefore, input signal O is transmitted through buffer circuit 51 acting as a one-stage inverter to output section 201 with a delay time corresponding approximately to one inverter stage.

On the other hand, when the shift register stage is holding "L" (TE="L"), the output of inverter 48 is at the H level and, therefore, P-type MOSFET 39 and N-type MOSFET 43 are non-conductive, whereas P-type MOSFET 41 and N-type MOSFET 46 are conductive. Accordingly, input signal O is transmitted through the exclusive NOR circuit 50 and second buffer circuit 52 to the output section 201 with a delay time corresponding to approximately three inverter stages. Specifically, in the exclusive NOR circuit 50, an output is developed through NAND circuits 401 and 403, or through OR circuit 402 and NAND circuit 403, which give a delay corresponding to two inverter stages to the output, and the buffer circuit 52 acts as a one-stage inverter. Accordingly, as stated above, the output provided through circuits 50 and 52 has been given a delay corresponding to three inverter stages.

It should be noted, however, that in the normal operation of the circuit in which the signal TE is set to "H", the delay given to input signal O when it is transmitted from the input terminal to output section 201 is a delay corresponding to one inverter stage. On the other hand, in the output circuit according to the sixth embodiment, shown in FIG. 21, which uses, as circuit 37, output circuit 36 shown in FIG. 19, a delay of two stages, namely, NOR circuits 301 and 303, is given to the input signal O. Thus, the delay time is shorter by one stage in the circuit of FIG. 22 than in the output circuit of FIG. 21.

For this arrangement, too, it is possible to determine the reference time period for selection, T, by setting "H" or "L" in the respective shift register stages, in the manner as explained with reference to the sixth embodiment shown in FIG. 21.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An output circuit for a semiconductor integrated circuit comprising:

output means for providing an output signal in accordance with an input signal;

said input signal having one of a first and a second state; and control means, receiving a reference signal and a control signal delayed relative to said reference signal, for controlling a timing of occurrence of said output signal and an output impedance of said output means in accordance with combinations of said control signal and said reference signal.

2. An output circuit for a semiconductor integrated circuit, according to claim 1 comprising:

said output means including a first switching means which is conductive when said first switching means receives a first output control signal in a first state, and is non-conductive when said first switching means receives said first output control signal in a second state;

said output means including a second switching means which is conductive when said second switching means receives a second output control signal in said second state, and is non-conductive when said second switching means receives said second output control signal in said first state;

said first and second switching means are connected in series between a first and a second potential;

said output means has an output node provided at a junction between said first and said second switching means; and said first and second output control signals being produced by said control means and being responsive to combinations of states of said control signal, said reference signal, and said input signal.

3. An output circuit for a semiconductor integrated circuit comprising:

output means for providing an output signal in accordance with an input signal;

said input signal having one of a first and a second state;

control means, receiving a control signal delayed relative to a reference signal, for controlling a timing of occurrence of said output signal in accordance with said control signal;

said output means including a first switching means which is conductive when said first switching means receives a first output control signal in a first state, and is non-conductive when said first switching means receives said first output control signal in a second state; and said output means including a second switching means which is conductive when said second switching means receives a second output control signal in said second state, and is non-conductive when said second switching means receives said second output control signal in said first state;

said first and second switching means being connected in series between a first and a second potential;

said output means having an output node provided at a junction between said first and said second switching means;

said control means including a first means for receiving said reference signal and said control signal;

each of said reference and control signals having one of a first and a second state;

said first means producing a signal in said first state when said control signal is in said first state;

said first means producing said signal in said first state when said control and reference signals are in said second and first states, respectively;

said first means producing said signal in said second state when said control and reference signals are in their second states;

a second means for receiving said signal of said first means and said input signal;

said second means providing said first and second output control signals in said second and first states to said first and second switching means, respectively, when said signal from said first means is in said first state;

said second means providing said first and second output control signals in said first state to said first and second switching means when said signal from said first means is in said second state and said input signal is in said first state; and said second means providing said first and second output control signals in said second state to said first and second switching means when said signal from said first means in said second state and said input signal is in said second state.

4. An output circuit for a semiconductor integrated circuit, according to claim 3 wherein:

said first means includes a first NAND circuit; and said second means includes an inverter, for inverting said signal of said first means from said first NAND circuit, a second NAND circuit which receives said signal from said inverter and said input signal, and a NOR circuit which receives said output signal from said first NAND circuit and said input signal.

5. An output circuit for a semiconductor integrated circuit comprising:

output means for providing an output signal in accordance with an input signal;

said input signal having one of a first and a second state;

control means, receiving a control signal delayed relative to a reference signal, for controlling a timing of occurrence of said output signal in accordance with said control signal;

said output means including a first switching means which is conductive when said first switching means receives an output control signal in a first state, and is non-conductive when said first switching means receives said output control signal in a second state; and said output means including a second switching means which is conductive when said second switching means receives said output control signal in said second state, and is non-conductive when said second switching means receives said output control signal in said first state;

said first and second switching means being connected in series between a first and a second potential;

said output means having an output node provided at a junction between said first and said second switching means; and said control means including a NAND circuit which receives said control signal and said input signal.

6. An output circuit for a semiconductor integrated circuit comprising:

output means for providing an output signal in accordance with an input signal;

said input signal having one of a first and a second state;

control means, receiving a control signal delayed relative to a reference signal, for controlling a timing of occurrence of said output signal in accordance with said control signal;

said output means including a first switching means which is conductive when said first switching means receives an output control signal in a first state, and is non-conductive when said first switching means receives said output control signal in a second state; and said output means including a second switching means which is conductive when said second switching means receives said output control signal in said second state, and is non-conductive when said second switching means receives said output control signal in said first state;

said first and second switching means being connected in series between a first and a second potential;

said output means having an output node provided at a junction between said first and said second switching means; and said control means including a an exclusive OR circuit which receives said control signal and said input signal.

7. An output circuit for a semiconductor integrated circuit comprising:

output means for receiving an input signal having one of a first and a second state, and for providing an output signal in accordance with said input signal;

storage means for receiving a first control signal having one of a first and a second state, and for storing said first control signal therein; and control means, receiving said first control signal stored in said storage means, and a second control signal having one of a first and a second state, for controlling a timing of occurrence of said output signal in said output means in response to a transition of said second control signal from said first to said second state, when said first control signal is in said first state.

8. An output circuit for a semiconductor integrated circuit, according to claim 7 wherein said output means includes:

a first switching means which is conductive when said first switching means receives an output control signal in a first state, and is non-conductive when said first switching means receives said output control signal in a second state;

a second switching means which is conductive when said second switching means receives said output control signal in said second state, and is non-conductive when said second switching means receives said output signal in said first state;

said first and second switching means are connected in series between a first and a second potential; and said output means has an output node provided at a junction between said first and said second switching means.

9. An output circuit for a semiconductor integrated circuit, according to claim 8 wherein said output means includes:

an OR means for receiving said first and second control signals;

a first means for receiving an output signal from said OR means and a reference signal having one of a first and a second state;

said first means producing said output signal in said first state when said output signal from said OR means is in said first state;

said first means producing said output signal in said first state when said output signal from said OR means is in said second state and said reference signal in said first state;

said first means producing said output signal in said second state when said output signal from said OR means and said reference signal are in said second state;

a second means for receiving said output signal of said first means and said input signal;

said second means providing said output control signal in said second and first states to said first and second switching means respectively, when said output signal from said first means is in said first state;

said second means providing said output control signal in said first state to said first and second switching means when said output signal from said first means is in said second state and said input signal in said first state; and said second means providing said output control signal in said second state to said first and second switching means when said output signal from said first means is in said second state and said input signal is in said second state.

10. An output circuit for a semiconductor integrated circuit, according to claim 9 wherein:

said first means includes a first NAND circuit; and said second means includes an inverter, for inverting said output signal from said first NAND circuit, a second NAND circuit which receives said output signal from said inverter and said input signal, and a NOR circuit which receives said output signal from said first NAND circuit and said input signal.

11. An output circuit for a semiconductor integrated circuit, according to claim 8 wherein said control means includes:

OR means for receiving said first and second control signals; and a NAND circuit for receiving said output signal from said OR means and said input signal.

12. An output circuit for a semiconductor integrated circuit, according to claim 8 wherein said control means comprises: OR means which receives said first and second control signals; and an exclusive OR circuit which receives an output signal from said OR means and said input signal.

13. An output circuit for a semiconductor integrated circuit, according to claim 8 wherein said control means includes:

a first means which receives said input signal, and provides an output signal to said first and second switching means when said first control signal is in said first state;

an exclusive OR means which receives said input signal and said second control signal; and a second means which receives an output signal from said exclusive OR means, and provides an output signal to said first and second switching means when said first control signal is in said second state.

* * * * *